United States Patent
Lee et al.

(10) Patent No.: US 7,595,240 B2
(45) Date of Patent: Sep. 29, 2009

(54) FLASH MEMORY DEVICE WITH STACKED DIELECTRIC STRUCTURE INCLUDING ZIRCONIUM OXIDE AND METHOD FOR FABRICATING THE SAME

(75) Inventors: Seung-Ryong Lee, Ichon-shi (KR); Moon-Sig Joo, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 11/582,705

(22) Filed: Oct. 17, 2006

(65) Prior Publication Data
US 2007/0249125 A1    Oct. 25, 2007

(51) Int. Cl.
*H01L 21/336* (2006.01)
(52) U.S. Cl. .................. 438/264; 257/E21.422
(58) Field of Classification Search ............ 257/E21.01; 438/264
See application file for complete search history.

(56) References Cited

U.S. PATENT DOCUMENTS

| | | | |
|---|---|---|---|
| 6,630,392 B2 * | 10/2003 | Kim et al. ................. 438/586 | |
| 6,660,660 B2 | 12/2003 | Haukka et al. | |
| 6,753,224 B1 | 6/2004 | Lin et al. | |
| 6,753,570 B1 | 6/2004 | Tripsas et al. | |
| 2002/0115252 A1 | 8/2002 | Haukka et al. | |
| 2002/0153579 A1 | 10/2002 | Yamamoto | |
| 2004/0121534 A1 | 6/2004 | Lin et al. | |
| 2006/0220106 A1 * | 10/2006 | Choi et al. .................. 257/324 | |

FOREIGN PATENT DOCUMENTS

| KR | 1020040002818 A | 1/2004 |
|---|---|---|
| KR | 1020050062132 A | 6/2005 |

OTHER PUBLICATIONS

Wolf, S. "Silicon Processingfor the VLSI Era" vol. 4. 2002 pp. 145-147.*
Divisional Application of Korean Application 1020030085514 Nov. 28, 2003.*

* cited by examiner

*Primary Examiner*—Fernando L Toledo
*Assistant Examiner*—Grant S Withers
(74) *Attorney, Agent, or Firm*—Townsend and Townsend and Crew LLP (57) ABSTRACT

A dielectric structure disposed between a floating gate and a control gate of a flash memory device includes: a first dielectric layer; a third dielectric layer having a k-dielectric constant substantially the same as that of the first dielectric layer; and a second dielectric layer disposed between the first dielectric layer and the third dielectric layer, having a greater k-dielectric constant than that of the first and third dielectric layers and formed by alternately and repeatedly stacking a plurality of aluminum oxide ($Al_2O_3$) layers and a plurality of zirconium oxide ($ZrO_2$) layers.

19 Claims, 6 Drawing Sheets

FIG. 6B

FLASH MEMORY DEVICE WITH STACKED DIELECTRIC STRUCTURE INCLUDING ZIRCONIUM OXIDE AND METHOD FOR FABRICATING THE SAME

CROSS-REFERENCES TO RELATED APPLICATIONS

The present application claims priority to Korean Application No. KR 2006-0036924, filed Apr. 24, 2006, which is incorporated herein by reference.

BACKGROUND OF THE INVENTION

The present invention relates to a method for fabricating a semiconductor device; and more particularly, to a flash memory device with a dielectric layer having a high k-dielectric constant and a method for fabricating the same.

When using a conventional oxide-nitride-oxide (ONO) structure as a dielectric structure (i.e., an inter-poly oxide (IPO) layer or an inter-poly dielectric (IPD) layer) existing between a floating gate (FG) and a control gate (CG), a distance between devices decreases as the integration scale of semiconductor devices improves. Accordingly, it becomes difficult to perform a gap-filling process and thus, the devices are often hardly isolated.

Furthermore, as a size of the device has been reduced, a property of a capacitor for storing electric charges may be degraded. Accordingly, a high k-dielectric thin layer having a small thickness and a high k-dielectric constant is used as the IPO layer or the IPD layer.

Recently, a process of using a high k-dielectric thin layer with an OZO structure, formed by sequentially stacking an oxide layer, a zirconium oxide ($ZrO_2$) layer and an oxide layer has been suggested to overcome the aforementioned limitations.

Figure 1:
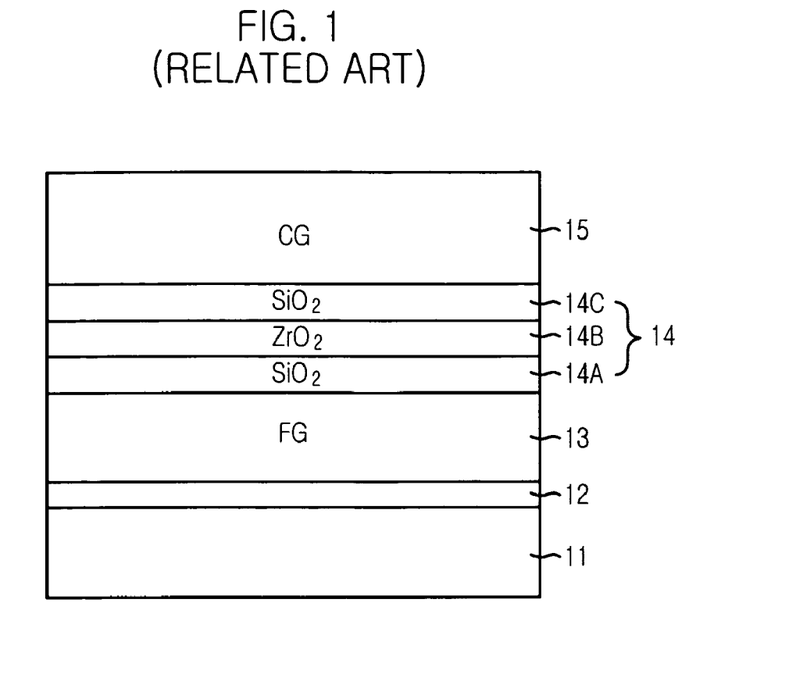
FIG. 1 is a cross-sectional view illustrating a conventional flash memory device.

FIG. 1 is a cross-sectional view illustrating a conventional flash memory device.

A tunnel oxide layer 12 is formed over a substrate 11, and a floating gate 13 is formed over the tunnel oxide layer 12. A dielectric structure 14 is formed over the floating gate 13. The dielectric structure 14 is formed by sequentially stacking a first silicon oxide ($SiO_2$) layer 14A, a zirconium oxide ($ZrO_2$) layer 14B, and a second silicon oxide ($SiO_2$) layer 14C. A control gate 15 is formed over the dielectric structure 14.

However, in the case of using the $ZrO_2$ layer, the $ZrO_2$ layer may be crystallized at a predetermined thickness or greater while forming a thin layer. Accordingly, along a grain boundary, current is likely to leak or a defect may be generated. As a result, device reliability may be degraded.

BRIEF SUMMARY OF THE INVENTION

The present invention provides a flash memory device using a zirconium oxide ($ZrO_2$) layer having a high k-dielectric constant as a dielectric layer, a low capacitive equivalent thickness (CET), a low leakage current level, and improved reliability, and a method for fabricating the same.

In accordance with one embodiment of the present invention, there is provided a dielectric structure disposed between a floating gate and a control gate of a flash memory device, including: a first dielectric layer; a third dielectric layer having a k-dielectric constant substantially the same as that of the first dielectric layer; and a second dielectric layer disposed between the first dielectric layer and the third dielectric layer, having a greater k-dielectric constant than that of the first and third dielectric layers and formed by alternately and repeatedly stacking a plurality of aluminum oxide ($Al_2O_3$) layers and a plurality of zirconium oxide ($ZrO_2$) layers.

In accordance with another embodiment of the present invention, there is provided a flash memory device, including: a substrate; a tunnel oxide layer formed over the substrate; a floating gate formed over the tunnel oxide layer; a first dielectric layer formed over the floating gate; a second dielectric layer formed by alternately and repeatedly stacking a plurality of $Al_2O_3$ layers and a plurality of $ZrO_2$ layers over the first dielectric layer and having a greater k-dielectric constant than that of the first dielectric layer; a third dielectric layer formed over the second dielectric layer and having substantially the same k-dielectric constant as that of the first dielectric layer; and a control gate formed over the third dielectric layer.

In accordance with a further embodiment of the present invention, there is provided a method for forming a dielectric structure disposed between a floating gate and a control gate of a flash memory device, including: forming a first dielectric layer; forming a second dielectric layer in a stack structure that has a greater k-dielectric constant than that of the first dielectric layer by alternately and repeatedly stacking a plurality of $Al_2O_3$ layers and a plurality of $ZrO_2$ layers over the first dielectric layer; and forming a third dielectric layer that has substantially the same k-dielectric constant as that of the first dielectric layer over the second dielectric layer.

In accordance with still another embodiment of the present invention, there is provided a method for fabricating a flash memory device, including: forming a tunnel oxide layer over a substrate; forming a floating gate over the tunnel oxide layer; forming a first dielectric layer over the floating gate; forming a second dielectric layer in a stack structure that has a greater k-dielectric constant than that of the first dielectric layer by alternately and repeatedly stacking a plurality of $Al_2O_3$ layers and a plurality of $ZrO_2$ layers over the first dielectric layer; forming a third dielectric layer that has substantially the same k-dielectric constant as that of the first dielectric layer over the second dielectric layer; and forming a control gate over the third dielectric layer.

BRIEF DESCRIPTION OF THE DRAWINGS

The above features of the present invention will become better understood with respect to the following description of the exemplary embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

Figure 2:
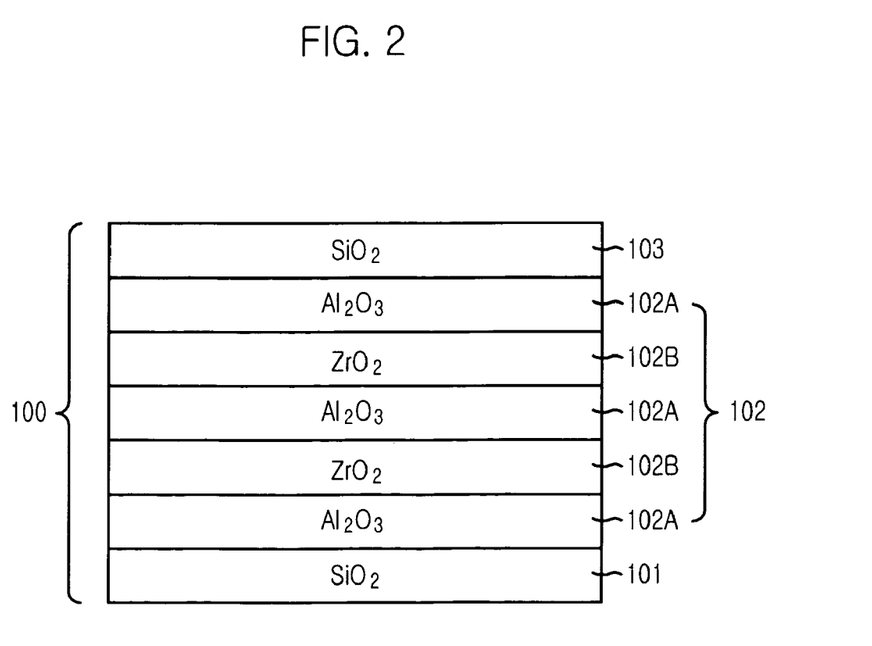
FIG. 2 is a cross-sectional view illustrating a dielectric structure of a flash memory device in accordance with an embodiment of the present invention.

FIG. 2 is a cross-sectional view illustrating a dielectric structure of a flash memory device in accordance with an embodiment of the present invention.

The dielectric structure 100 of the flash memory device includes a first dielectric layer 101; a third dielectric layer 103 having substantially the same k-dielectric constant as the first dielectric layer 101; and a second dielectric layer 102 disposed between the first dielectric layer 101 and the third dielectric layer 103. The second dielectric layer 102 has a greater k-dielectric constant than the first dielectric layer 101 and the third dielectric layer 103, and is formed by alternately and repeatedly stacking an aluminum oxide ($Al_2O_3$) layer 102A and a zirconium oxide ($ZrO_2$) layer 102B. The dielectric structure 100 has a stack structure formed by sequentially stacking the first dielectric layer 101, the second dielectric layer 102 and the third dielectric layer 103. Particularly, these alternately and repeatedly stacked $Al_2O_3$ layer 102A and the $ZrO_2$ layer 102B will be denoted as "AZAZA structure".

The first dielectric layer 101 and the third dielectric layer 103 individually include a silicon oxide ($SiO_2$) layer, and the second dielectric layer 102 is a stacked AZAZA structure. Thus, the dielectric structure 100 becomes an OAZAZAO structure.

In more detail about the second dielectric layer 102, the $Al_2O_3$ layer 102A contacts with the first dielectric layer 101 and the third dielectric layer 103 as shown in the AZAZA structure to reduce silicon diffusion. Specifically, the $Al_2O_3$ layer 102A can prevent silicon from the first dielectric layer 101 and from the third dielectric layer 103 from diffusing to the corresponding $ZrO_2$ layer 102B by being interposed between the first dielectric layer 101 and the $ZrO_2$ layer 102B and between the third dielectric layer and the $ZrO_2$ layer 102B.

Accordingly, the OAZAZAO structure in this embodiment of the present invention has a stack structure which additionally includes the $Al_2O_3$ layers 102A between the $SiO_2$ layers and the ZAZ structure. In one embodiment of the present invention, a k-dielectric constant of the $ZrO_2$ layer 102B is not decreased due to the additionally formed $Al_2O_3$ layers 102A.

Furthermore, for the number of stacked $Al_2O_3$ layers, the OAZAZAO structure includes two more $Al_2O_3$ layers than the ZAZ structure and thus, the $ZrO_2$ layer 102B can have substantially the same k-dielectric constant as the ZAZ structure although the $ZrO_2$ layers 102B are thinly formed. Accordingly, since the $ZrO_2$ layers 102B can be thinly formed, the $ZrO_2$ layers 102B is not likely to be crystallized while forming the $ZrO_2$ layers 102B.

As shown in the OAZAZAO structure (or stacked structure), the $ZrO_2$ layer 102B is stacked twice and the $Al_2O_3$ layer 102A is stacked three times. It should be appreciated that stacking more of the $Al_2O_3$ layers could be undesirable. For instance, if the $Al_2O_3$ layer 102A is stacked four times, the number of the $ZrO_2$ layers 102B to be stacked is decreased to one. That is, if a proportion of the $ZrO_2$ layers 102B is decreased (i.e., from two layers to one layer) in the stacked structure, a capacitive equivalent thickness (CET) and a leakage current level are increased. Accordingly, a desirable stack structure to obtain a low CET and a low leakage current level is the OAZAZAO structure.

Figure 3A:
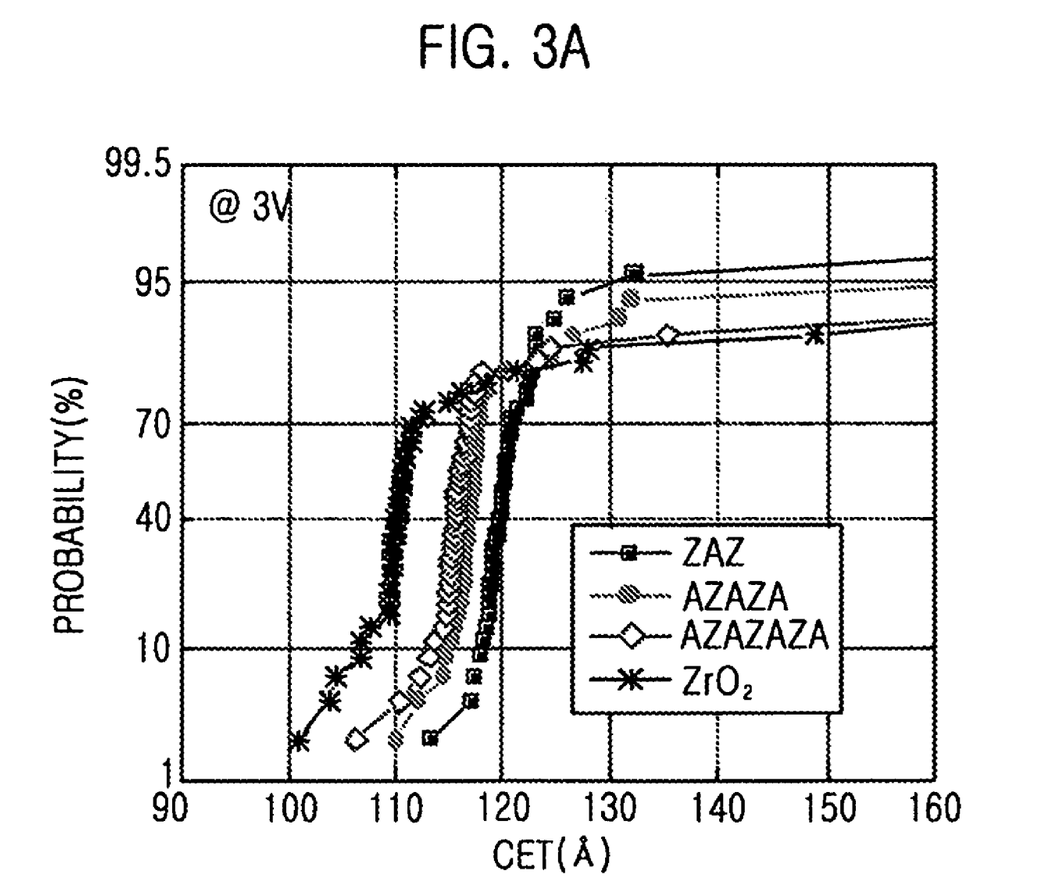
FIG. 3A is a graph of a capacitive equivalent thickness (CET) that varies depending on various stack structures.
Figure 3B:
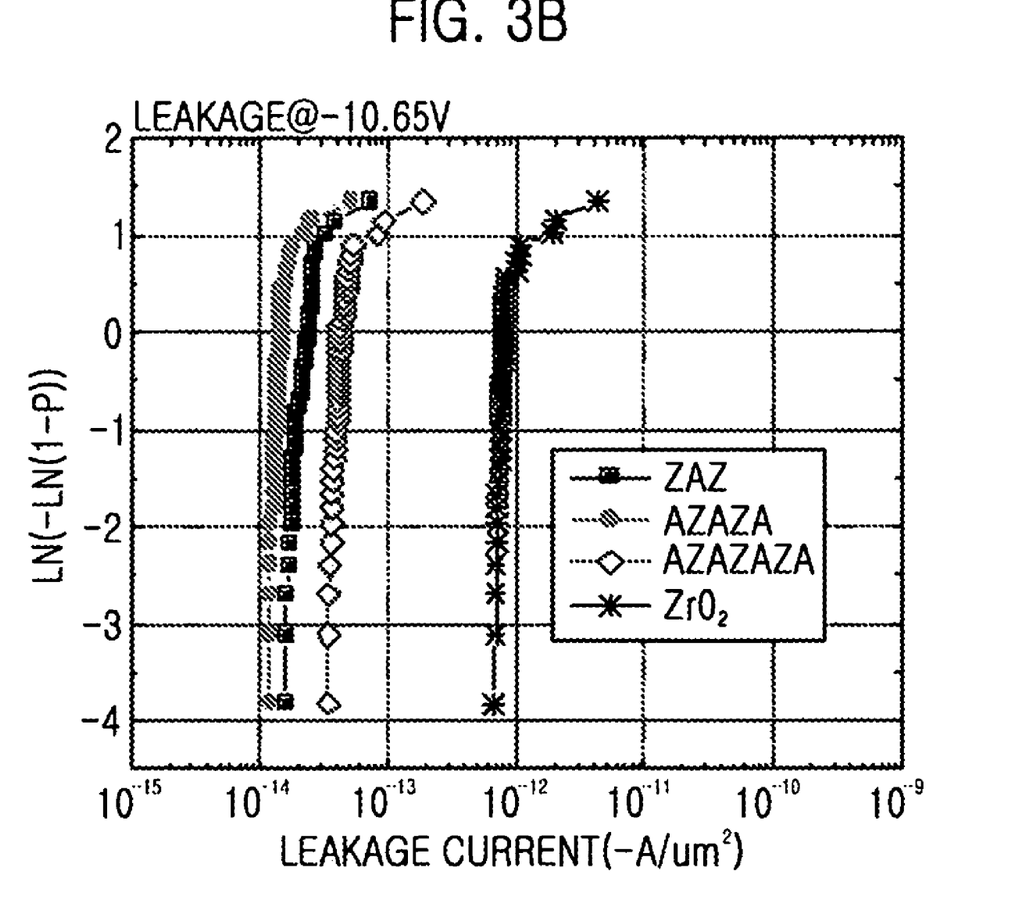
FIG. 3B is a graph of leakage current level that varies depending on various stack structure.

FIG. 3A is a graph of a capacitive equivalent thickness (CET) that varies depending on various stack structures and FIG. 3B is a graph of leakage current level that varies depending on various stack structures. The stacked dielectric structures compared with each other in FIGS. 3A and 3B are a ZAZ structure, an AZAZA structure, an AZAZAZA structure and a $ZrO_2$ layer.

As shown in FIG. 3A, the $ZrO_2$ layer has the lowest CET and the ZAZ structure has the highest CET. The AZAZA structure has a larger CET than the AZAZAZA structure but a lower CET than the ZAZ structure.

As shown in FIG. 3B, the $ZrO_2$ layer has the highest leakage current, and the AZAZA structure has the lowest leakage current. For reference, the AZAZAZA structure has higher leakage current than the ZAZ structure.

From the results shown in FIGS. 3A and 3B, the AZAZA structure has a larger CET and a lower leakage current than the AZAZAZA structure and the ZAZ structure.

The second dielectric layer 102 with the AZAZA structure shown in FIG. 2 can be formed through an atomic layer deposition (ALD) method or a chemical vapor deposition (CVD) method.

Hereinafter, a deposition method of the AZAZA structure through the ALD method will be examined.

Figure 4:
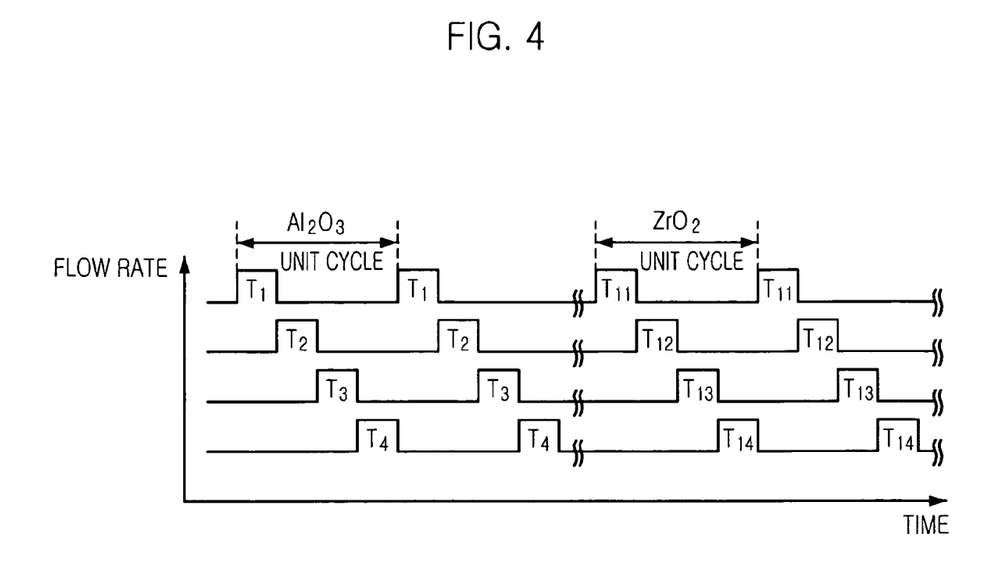
FIG. 4 is a simplified diagram illustrating an atomic layer deposition (ALD) method to form an $Al_2O_3/ZrO_2/Al_2O_3/ZrO_2/Al_2O_3$ structure in accordance with an embodiment of the present invention.

FIG. 4 is a diagram briefly illustrating an ALD method to form an AZAZA structure in accordance with an embodiment of the present invention.

The ALD method is generally performed by repeating a unit cycle until an atomic layer with a desirable thickness is obtained. The unit cycle includes supplying a source gas to a wafer loaded into a chamber, supplying a purge gas thereto, supplying a reaction gas thereto, and supplying a purge gas thereto.

In more detail of an $Al_2O_3$ layer deposition, an aluminum (Al) source gas is supplied to a chamber where a wafer is loaded and then, absorbed into a surface of the wafer. The Al source gas includes $Al(CH_3)_3$.

A purge gas is supplied into the chamber to purge out non-adsorbed parts of the Al source gas remaining inside the chamber. The purge gas includes an inert gas selected from a group consisting of argon (Ar), helium (He), nitrogen ($N_2$), and a combination thereof.

A reaction gas is supplied into the chamber. The reaction gas includes one selected from a group consisting of ozone ($O_3$), oxygen ($O_2$) plasma, and water ($H_2O$). A reaction between the Al source gas and the reaction gas is induced to deposit an $Al_2O_3$ layer. Accordingly, the $Al_2O_3$ layer is formed over the surface of the wafer in an atomic unit.

A purge gas is supplied into the chamber to purge out non-reacted parts of the reaction gas and byproducts. The purge gas includes an inert gas selected from a group consisting of Ar, He, $H_2$, and a combination thereof.

As described above, the $Al_2O_3$ layer with a desirable thickness can be deposited by repeating the unit cycle including supplying the Al source gas, supplying the purge gas, supplying the reaction gas, and supply the purge gas. Theses sequential steps are denoted with reference letters $T_1$, $T_2$, $T_3$, and $T_4$ in FIG. 4.

Depositing a $ZrO_2$ layer based on the ALD method will be examined hereinafter.

A zirconium (Zr) source gas is supplied to a chamber where a wafer is loaded and then, adsorbed into a surface of the wafer. The Zr source gas includes one selected from a group consisting of $Zr(O\text{-}tBu)_4$, $Zr[N(CH_3)_2]_4$, $Zr[N(C_2H_5)(CH_3)]$ $_4$, Zr[N(C$_2$H$_5$)$_2$]$_4$, Zr(tmhd)$_4$, Zr(OiC$_3$H$_7$)$_3$(tmhd) and Zr(OtBu)$_4$. The above listed materials are known as a precursor.

A purge gas is supplied into the chamber to purge out non-adsorbed parts of the Zr source gas remaining inside the chamber. The purge gas includes an inert gas selected from a group consisting of Ar, He, N$_2$, and a combination thereof.

A reaction gas is supplied into the chamber. The reaction gas includes one selected from a group consisting of O$_3$, O$_2$ plasma and H$_2$O. A reaction between the Zr source gas and the reaction gas is induced to deposit a ZrO$_2$ layer. Accordingly, the ZrO$_2$ layer is formed over the surface of the wafer in an atomic unit.

A purge gas is supplied into the chamber to purge out non-reacted parts of the reaction gas and byproducts. The purge gas includes an inert gas selected from a group consisting of Ar, He, N$_2$, and a combination thereof.

As described above, the ZrO$_2$ layer with a desirable thickness can be deposited by repeating the unit cycle including supplying the Zr source gas, supplying the purge gas, supplying the reaction gas, and supplying the purge gas. These sequential steps are denoted with reference letters $T_{11}$, $T_{12}$, $T_{13}$, and $T_{14}$ in FIG. 4.

The Al$_2$O$_3$ layers and the ZrO$_2$ layers are alternately deposited through the ALD method to form the AZAZA structure. Meanwhile, the depositing of the Al$_2$O$_3$ layers and the ZrO$_2$ layers uses the same purge gas and reaction gas except for the source gas. Accordingly, the Al$_2$O$_3$ layers and the ZrO$_2$ layers can be alternately deposited only by changing the source gas at the same ALD chamber.

Figure 5:
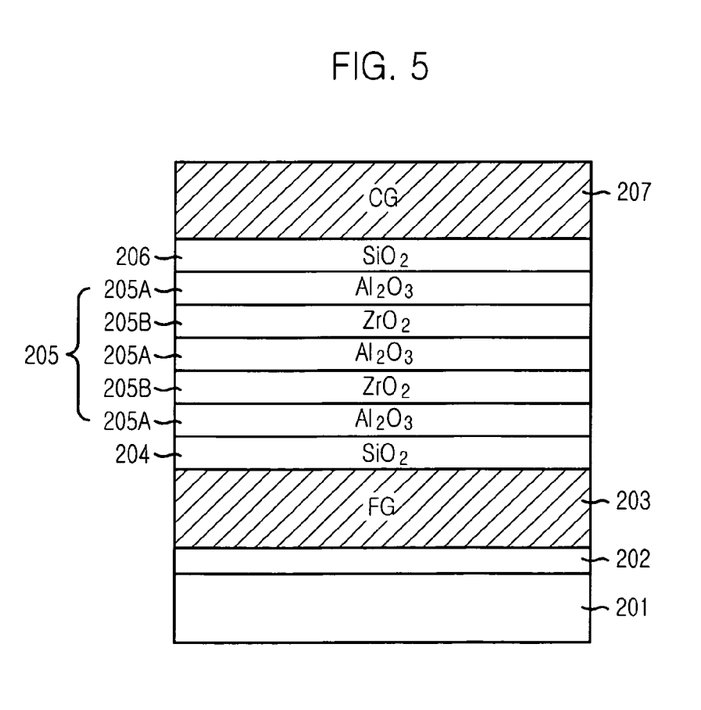
FIG. 5 is a cross-sectional view illustrating a flash memory device using the dielectric structure shown in FIG. 2.

FIG. 5 is a cross-sectional view illustrating a flash memory device using the dielectric structure shown in FIG. 2.

The flash memory device includes a substrate 201, a tunnel oxide layer 202 over the substrate 201, a floating gate FG 203, a first dielectric layer 204 over the floating gate FG 203, a second dielectric layer 205 having a k-dielectric constant greater than the first dielectric layer 204 formed over the first dielectric layer 204 by alternately and repeatedly stacking an Al$_2$O$_3$ layer 205A and a ZrO$_2$ layer 205B, a third dielectric layer 206 formed over the second dielectric layer 205 and having substantially the same k-dielectric constant as the first dielectric layer 204, and a control gate CG 207 over the third dielectric layer 206.

The tunnel oxide layer 202 includes a SiO$_2$ layer, and the floating gate FG 203 and the control gate CG 207 includes a polysilicon layer.

The first dielectric layer 204 and the third dielectric layer 206 are SiO$_2$ layers, and the second dielectric layer 205 has an AZAZA structure, which is a stack structure of the Al$_2$O$_3$ layer 205A, the ZrO$_2$ layer 205B, the Al$_2$O$_3$ layer 205A, the ZrO$_2$ layer 205B, and the Al$_2$O$_3$ layer 205A.

A method for fabricating the flash memory device shown in FIG. 5 will be examined hereinafter.

The tunnel oxide layer 202 is formed over the substrate 201 completed with a well formation process and a channel ion-implantation process and other related processes. The tunnel oxide layer 202 is formed through one of a thermal oxidation method and a CVD method.

The floating gate 203 is formed over the tunnel oxide layer 202. The floating gate 203 includes the polysilicon layer.

The first dielectric layer 204 is formed over the floating gate 203. The first dielectric layer includes the SiO$_2$ layer formed through an ALD method or a CVD method.

A dielectric layer having a greater k-dielectric constant than the first dielectric layer 204 is formed over the first dielectric layer 204. That is, an AZAZA structure is formed by alternately and repeatedly stacking the Al$_2$O$_3$ layer 205A and the ZrO$_2$ layer 205B over the first dielectric layer 204. When the Al$_2$O$_3$ layer 205A and the ZrO$_2$ layer 205B are alternately and repeatedly stacked, the Al$_2$O$_3$ layer 205A contacts with the first dielectric layer 204 or the third dielectric layer 206. The third dielectric layer 206 is formed over the second dielectric layer 205. The third dielectric layer 206 includes the SiO$_2$ layer as similar to the first dielectric layer 204. Accordingly, the high k-dielectric second dielectric layer 205 formed between the low k-dielectric first dielectric layer 204 and the low k-dielectric third dielectric layer 206 gives rise to an OAZAZAO structure.

The control gate 207 is formed over the third dielectric layer 206, and the control gate 207 includes the polysilicon layer.

The dielectric structure of the flash memory device between the floating gate 203 and the control gate 207 is a stack structure of the first dielectric layer 204, the second dielectric layer 205, and the third dielectric layer 206, more particularly, of an OAZAZAO (SiO$_2$/Al$_2$O$_3$/ZrO$_2$/Al$_2$O$_3$/ZrO$_2$/Al$_2$O$_3$/SiO$_2$) structure. The OAZAZAO structure is formed with a thickness ranging from approximately 50 Å to approximately 200 Å.

Comparing the OAZAZAO dielectric structure with the OZAZO dielectric structure, the OAZAZAO dielectric structure can prevent silicon from diffusing to the ZrO$_2$ layer 205B by interposing repeatedly the Al$_2$O$_3$ layer 205A between the ZrO$_2$ layer 205B before depositing the third electric layer including the SiO$_2$ layer. Accordingly, a ZrSiO layer cannot be formed, and a k-dielectric constant of the ZrO$_2$ layer cannot be reduced.

Furthermore, in an OZAO structure or an OZO structure, as impurities such as silicon diffuse into a grain boundary of the ZrO$_2$ layer 205B, a leakage current is likely to increase and device reliability may be degraded. However, in the OAZAZAO structure, the above described limitations can be reduced by repeatedly interposing the Al$_2$O$_3$ layer 205A between the ZrO$_2$ layers 205B. Thus, the leakage current can be decreased and the device reliability can be improved.

Figure 6A:
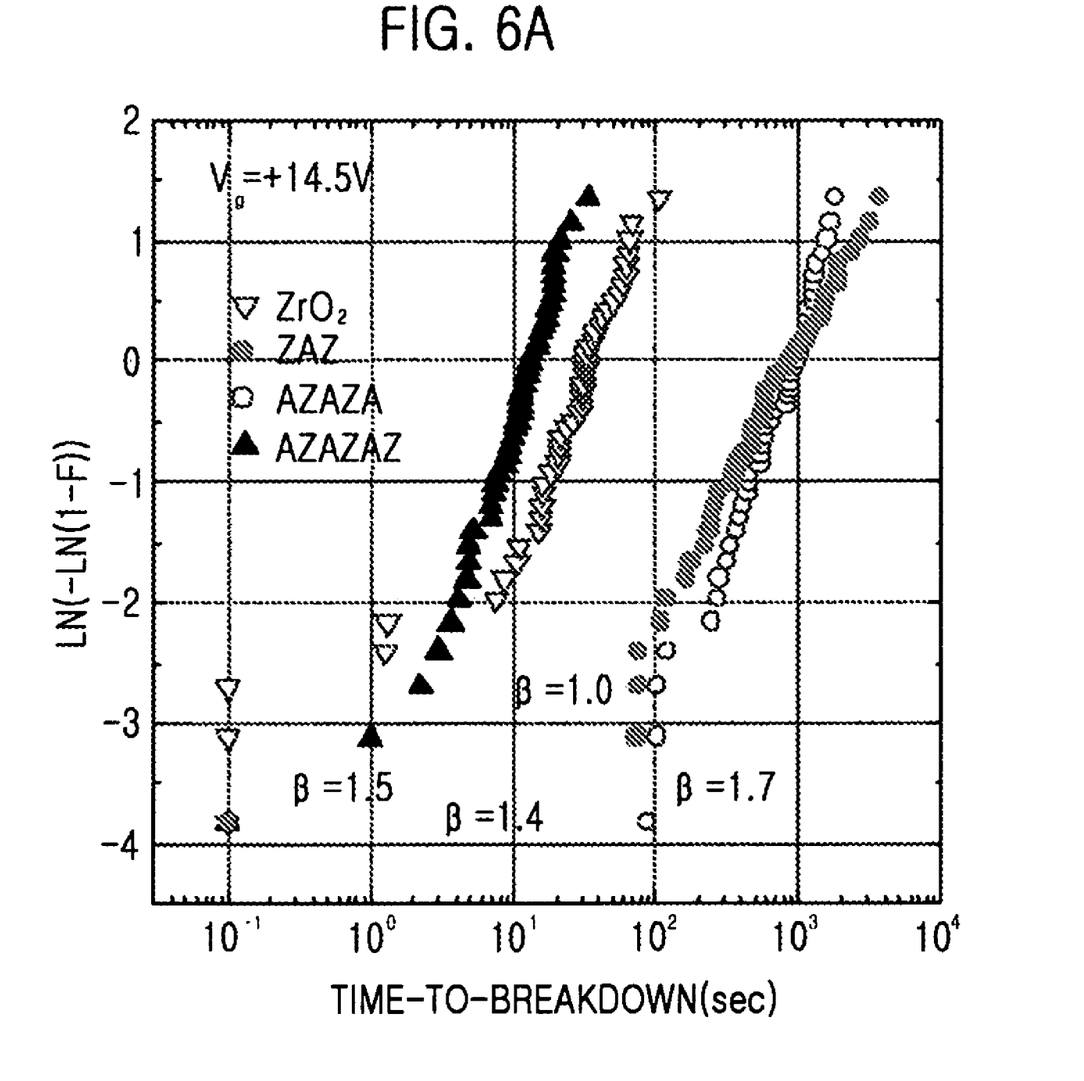
FIGS. 6A and 6B are Weibull plots illustrating time-to-breakdown (TBD) distributions in accordance with the embodiment of the present invention.
Figure 6B:
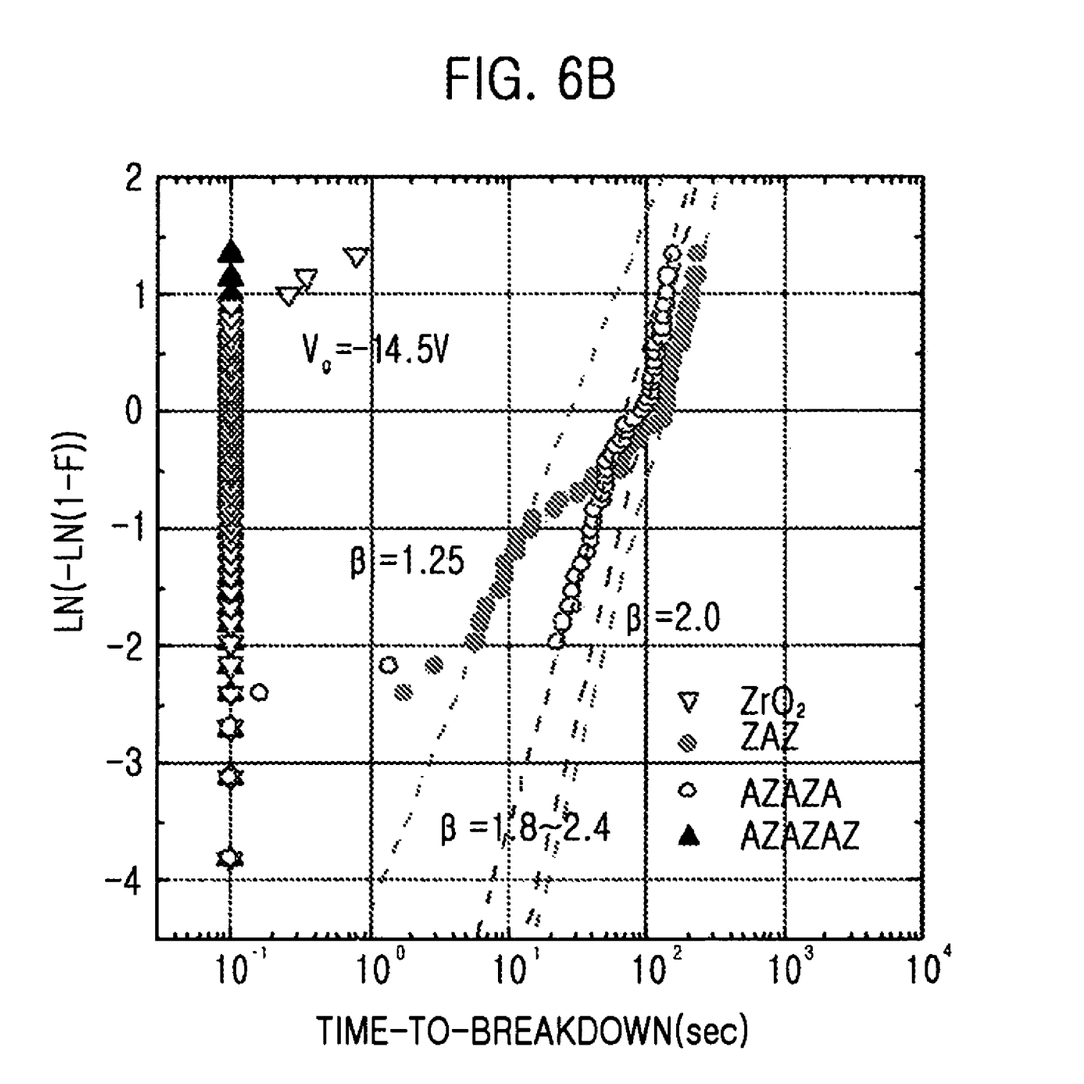

FIGS. 6A and 6B are Weibull plots illustrating time-to-breakdown (TBD) distributions in accordance with an embodiment of the present invention. FIG. 6A shows the TBD distribution when a positive polarity stress is exerted, and FIG. 6B shows the TBD distribution when a negative polarity stress is exerted. Herein, the positive polarity stress voltage level is approximately +14.5 V and the negative polarity stress voltage level is approximately −14.5 V.

A ZAZ structure seems to exhibit a TBD distribution obtained when a bi-modal breakdown process is applied under a stress voltage of approximately −14.5 V. The ZAZ structure seems to have small (with β=approximately 1.25) and large (with β=approximately 2.0) TBD distribution components together.

In more details about FIGS. 6A and 6B, the AZAZA dielectric structure has a much longer lifetime than other dielectric structures. Accordingly, comparing with other dielectric structures, reliability of the AZAZA dielectric structure can be improved.

According to this embodiment of the present invention, a dielectric structure of a flash memory device uses an OAZAZAO (SiO$_2$/Al$_2$O$_3$/ZrO$_2$/Al$_2$O$_3$/ZrO$_2$/Al$_2$O$_3$/SiO$_2$) structure and thus, it is possible to obtain the flash memory device having a low CET level and a low leakage current level.

Furthermore, impurities such as silicon cannot diffuse into a grain boundary of a ZrO$_2$ layer and thus, reliability can be improved.

While the present invention has been described with respect to certain embodiments, it will be apparent to those skilled in the art that various changes and modifications may be made without departing from the spirit and scope of the invention as defined in the following claims.

What is claimed is:

1. A method for forming a non-volatile memory device, the method comprising:
   forming a floating gate over a substrate;
   forming a first dielectric layer over the floating gate;
   forming a second dielectric layer over the first dielectric layer and having a k-dielectric constant greater than that of the first dielectric layer, the second dielectric layer including a plurality of aluminum oxide ($Al_2O_3$) layers and a plurality of zirconium oxide ($ZrO_2$) layers, wherein the second dielectric layer consists of three aluminum oxide layers and two zirconium oxide layers; and
   forming a third dielectric layer over and directly contacting the second dielectric layer.

2. The method of claim 1, wherein the $Al_2O_3$ layers and the $ZrO_2$ layers of the second dielectric layer are stacked such that a first $Al_2O_3$ layer and a last $Al_2O_3$ layer contact the first dielectric layer and with the third dielectric layer, respectively.

3. The method of claim 1, wherein the forming of the second dielectric layer includes sequentially stacking a first $Al_2O_3$ layer, a first $ZrO_2$ layer, a second $Al_2O_3$ layer, a second $ZrO_2$ layer, and a third $Al_2O_3$ layer.

4. The method of claim 3, wherein the second dielectric layer is formed using an atomic layer deposition (ALD) method.

5. The method of claim 4, wherein the ALD method for forming the first $Al_2O_3$ layer comprises:
   supplying a source gas comprising $Al(CH_3)_3$;
   supplying a reaction gas comprising one selected from a group consisting of ozone ($O_3$), oxygen ($O_2$) plasma, and water ($H_2O$); and
   supplying a purge gas comprising an inert gas.

6. The method of claim 4, wherein the ALD method for forming the first $ZrO_2$ layer comprises:
   supplying a source gas comprising one selected from a group consisting of $Zr(O\text{-}tBu)_4$, $Zr[N(CH_3)_2]_4$, $Zr[N(C_2H_5)(CH_3)]4$, $Zr[N(C_2H_5)_2]_4$, $Zr(tmhd)_4$, $Zr(OiC_3H_7)_3(tmhd)$ and $Zr(OtBu)_4$;
   supplying a reaction gas comprising one selected from a group consisting of ozone ($O_3$), oxygen ($O_2$) plasma, and water ($H_2O$); and
   supplying a purge gas comprising an inert gas.

7. The method of claim 1, wherein the first dielectric layer and the third dielectric layer comprises a $SiO_2$ layer.

8. The method, of claim 7, wherein a total thickness of the first dielectric layer, the second dielectric layer, and the third dielectric layer ranges from approximately 50 Å to approximately 200 Å.

9. A method for fabricating a flash memory device, comprising:
   forming a tunnel oxide layer over a substrate;
   forming a floating gate over the tunnel oxide layer;
   forming a first dielectric layer over the floating gate;
   forming a second dielectric layer having a greater k-dielectric constant than that of the first dielectric layer in a stack structure by alternately stacking a plurality of $Al_2O_3$ layers and a plurality of $ZrO_2$ layers over the first dielectric layer, wherein the second dielectric layer consists of three aluminum oxide layers and two zirconium oxide layers;
   forming a third dielectric layer that has substantially the same k-dielectric constant as that of the first dielectric layer over and directly contacting the second dielectric layer; and
   forming a control gate over the third dielectric layer.

10. The method of claim 9, wherein the $Al_2O_3$ layers and the $ZrO_2$ layers of the second dielectric layer are stacked such that a first $Al_2O_3$ layer and a last $Al_2O_3$ layer contact with the first dielectric layer and with the third dielectric layer, respectively.

11. The method of claim 10, wherein the forming of the second dielectric layer is performed by sequentially stacking the first $Al_2O_3$ layer, a first $ZrO_2$ layer, a second $Al_2O_3$ layer, a second $ZrO_2$ layer, and the last $Al_2O_3$ layer.

12. The method of claim 11, wherein the second dielectric layer is formed through one of an ALD method and a CVD method, or both.

13. The method of claim 9, wherein the first dielectric layer and the third dielectric layer comprise a $SiO_2$ layer.

14. The method of claim 13, wherein a total thickness from the first dielectric layer to the third dielectric layer ranges from approximately 50 Å to approximately 200 Å.

15. A method for fabricating a flash memory device, the method comprising:
   forming a tunneling insulation layer over a substrate;
   forming a charge trapping layer over the tunneling insulation layer;
   forming a first dielectric layer over the charge trapping layer;
   forming a second dielectric layer over the first dielectric layer, the second dielectric layer having a greater k-dielectric constant than that of the first dielectric layer, the second dielectric layer having a stack structure comprising a plurality of insulating layers of a first type and a plurality of insulating layers of a second type that are alternately stacked, the insulating layer of the first type including aluminum and oxygen, the insulating layer of the second type including zirconium and oxygen;
   forming a third dielectric layer that has substantially the same k-dielectric constant as that of the first dielectric layer over and directly contacting the second dielectric layer; and
   forming a gate electrode over the third dielectric layer,
   wherein the second dielectric layer consists of three insulating layers of the first type and two insulating layers of the second type.

16. The method of claim 15, wherein the insulating layers of the first type are $Al_2O_3$ layers and the insulating layers of the second type are $ZrO_2$ layers.

17. The method of claim 16, wherein one of the three $Al_2O_3$ layer is contacting the first dielectric layer and another of the three $Al_2O_3$ layers is contacting the third dielectric layer.

18. The method of claim 17, wherein the first and second dielectric layers are silicon oxide layers.

19. The method of claim 15, wherein a total thickness from the first dielectric layer to the third dielectric layer ranges from approximately 50 Å to approximately 200 Å.

* * * * *